United States Patent [19]
Ray, Jr.

[11] Patent Number: 4,755,761
[45] Date of Patent: Jul. 5, 1988

[54] ZERO INTERMEDIATE-FREQUENCY DEMODULATOR

[75] Inventor: Robert T. Ray, Jr., West Chester, Pa.

[73] Assignee: General Electric Company, Schenectady, N.Y.

[21] Appl. No.: 878,743

[22] Filed: Jun. 26, 1986

[51] Int. Cl.$^4$ ............................................. H03D 3/00
[52] U.S. Cl. .................................... 329/50; 329/124; 375/78
[58] Field of Search .................. 329/50, 110, 112, 122, 329/124; 375/44, 78, 80, 94, 88; 455/214

[56] References Cited

U.S. PATENT DOCUMENTS 4,612,509  9/1986  Betts et al. .................. 329/124 X
4,647,864  3/1987  Rafferty et al. .................. 329/122

OTHER PUBLICATIONS

"Noise Consideration in an Integrated Circuit VHF Radio Receiver", J. K. Goatcher et al., p. 49 et seq., Conference on Radio Receivers and Associated Systems, University of Leeds, Jul. 1981.

"Differential Detection of MSK with Non-Redundant Error Correction", T. Masamura et al., pp. 912–918, IEEE Transactions on Communications, vol. Com. 27, No. 6 (Jun. 1979).

Primary Examiner—Eugene R. LaRoche
Assistant Examiner—Robert J. Pascal
Attorney, Agent, or Firm—Geoffrey H. Krauss; James C. Davis, Jr.; Marvin Snyder

[57] ABSTRACT

A zero intermediate-frequency (IF) demodulator includes a pair of mixers receiving a quadrature local oscillator signal, for converting the FM-modulated input signal to an in-phase I baseband signal and a quadrature-phase Q baseband signal; each I and Q signal is then delayed and the I and Q signals and the delayed $I_d$ and $Q_d$ signals are arithmetically processed to generate first and second modulation-related signals, which are summed to provide the recovered modulation as an output signal. The arithmetic processing may use additive and/or multiplicative operations.

19 Claims, 8 Drawing Sheets

ZERO INTERMEDIATE-FREQUENCY DEMODULATOR

BACKGROUND OF THE INVENTION

The present application relates to apparatus for recovering the modulating signal from a frequency-modulated RF carrier signal and, more particularly, to a zero intermediate-frequency baseband signal processing demodulator.

It is well known to utilize a superheterodyne form of receiver, in which the received carrier signal is frequency converted to an intermediate frequency (IF) at which filtering and modulation detection are accomplished. While at least one IF amplifier-detector strip has been provided in integrated-circuit form (such as the LM373 IF integrated circuit available from National Semiconductor Co. and the like), a relatively large number of additional components, external to the integrated circuit, are required. Thus, the IF portion of a receiver cannot be provided solely in a monolithic integrated circuit.

The heterodyning of the received signal with a locally-generated signal at the carrier frequency, to produce a zero frequency, or baseband, IF signal for subsequent processing to detect the modulation thereon, is an idea well-known to the art. One such baseband IF demodulator, proposed by Vance in "An Integrated Circuit V.H.F. Radio Receiver", 50 *The Radio and Electronic Engineer*, No. 4, pp. 158–164 (April 1980) and in "Noise Considerations in an Integrated Circuit V.H.F. Radio Receiver", *Proc. of the Conf. on Radio Receivers and Associated Systems*, University of Leeds, pp. 49–66 (July 1981), utilizes differentiation of signals in crossed-multiplier arms and requires that the balance between the various arms be extremely well maintained to prevent distortion of the demodulated signal. The necessity to provide for balance adjustments mitigates against realization of this demodulator in a single monolithic integrated circuit. Accordingly, a baseband (zero IF) received signal demodulator capable of integration in a single IC, is highly desirable.

BRIEF SUMMARY OF THE INVENTION

In accordance with the invention, a zero IF demodulator includes: means for generating a local oscillator (LO) signal substantially at the frequency of an input frequency-modulated signal; means, receiving said LO signal, for converting the input signal to an in-phase I baseband signal and a quadrature-phase Q baseband signal; means for delaying each I and Q signal; arithmetic processing means for operating upon the I and Q signals and the delayed $I_d$ and $Q_d$ signals to generate first and second modulation-related signals; and means for summing the first and second signals to provide the recovered modulation as an output signal. The arithmetic processing means may use additive and/or multi processing means may use additive and/or multiplicative operations.

In presently preferred embodiments, the arithmetic processors either operate as self-multipliers to form the product of each of the I or Q signal with the delayed version $I_d$ or $Q_d$ signals, before addition, or operate as an adder/subtractor of the associated I or Q signal with the opposite delayed $Q_d$ or $I_d$ signal, prior to cross-multiplication and summation.

Accordingly, it is an object of the present invention to provide a novel zero intermediate-frequency (baseband) received-signal-processing demodulator, capable of full implementation in a single integrated circuit.

This and other objects of the present invention will become apparent upon reading the following detailed description, when considered in conjunction with the drawings.

BRIEF SUMMARY OF THE DRAWINGS

FIG. 7 is a schematic block diagram of a demodulator embodiment utilizing digital circuitry for implementation in CMOS integrated circuitry and the like;

DETAILED DESCRIPTION OF THE INVENTION

Figure 1:
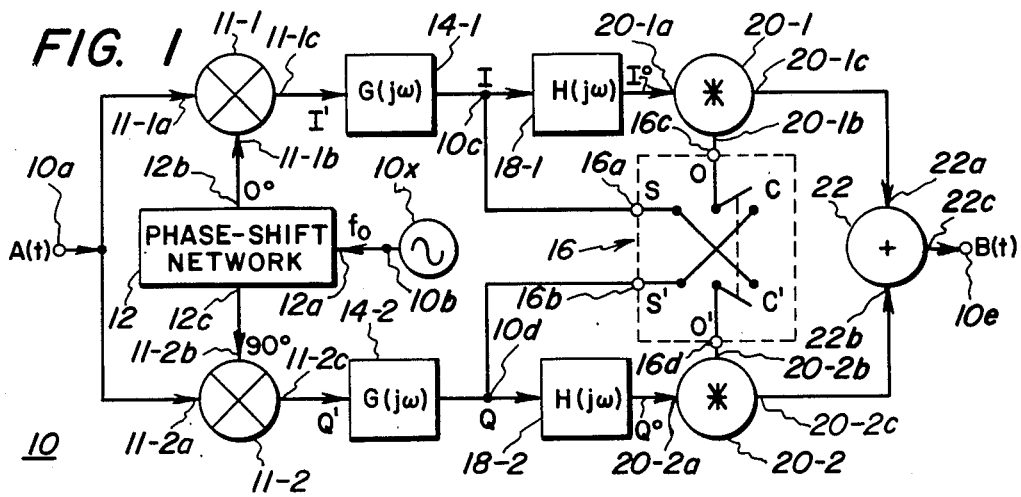
FIG. 1 is a schematic block diagram of a generic zero IF demodulator, in accordance with the present invention.

Referring initially to FIG. 1, a generic form of my novel fully-integratable zero intermediate-frequency (IF) demodulator 10 is shown. A received, modulated signal A(t) is coupled to the input 10a of generic demodulator 10. The input signal A(t) may have been previously subjected to amplification, filtering, limiting, frequency-conversion and the like processes, as required by the particular end usage of the equipment of which demodulator 10 forms a part. Oscillator means 10x, which may be either a part of the integrated circuit containing demodulator 10 or external to the integrated circuit, provides a periodically-varying signal to demodulator terminal 10b. This signal has a frequency $f_0$ substantially at the center frequency of the incoming modulated signal A(t). The center frequency signal is coupled to the input 12a of a phase-shift network 12, which provides first and second frequency $f_0$ signals at first and second outputs 12b and 12c, with an essentially orthogonal, or 90°, phase shift therebetween. The received signal at input 10a is coupled to the first input 11-1a and 11-2a of both associated first and second mixer-multiplier means 11-1 and 11-2. Each mixer-multiplier means has an associated second input 11-1b or 11-2b, respectively, receiving an associated one of the 0° or 90° phase-shifted signal from phase-shift network output 12b or 12c. Responsive to the in-phase received signal inputs and the quadrature-phased local oscillator signal inputs, the mixer-modulator means outputs 11-1c or 11-2c provide an associated one of an in-phase I' signal or a quadrature-phase Q' signal. A first transfer function $G(j\omega)$ separately operates upon each of the I' or Q' signal, in an associated one of series-networks 14-1 or 14-2, to yield either a baseband in-phase I signal ($I = \cos(\omega t)$), or a baseband quadrature-phased Q signal ($Q = \sin(\omega t)$), where $\omega$ is the frequency difference between the instantaneous frequency of the modulated signal A(t) and the local oscillator signal $\omega_0 2\pi f_0$. The in-phase I signal is provided to a first input 16a of a demodulator configuration switch means 16, which receives the quadrature-phased Q signal at its second input 16b. First and second output terminals 16c and 16d are respectively connected to switch outputs O and O', which act as if switching means 16 were a double-pole, double-throw switch having a first pole with selectable contacts S (connected to input 16a) C (connected to second input 16b) and having a second pole with selectable contacts (connected to second input 16b) and C' (connected to first input 16a). The in-phase I signal is also coupled to a transfer-function means 18-1 having a second transfer function $H(j\omega)$: the quadrature-phased Q signal is applied through another transfer function means 18-2, having the same transfer function $H(j\omega)$. The I° output of transfer function means 18-1 or the Q° output of means 18-2 is respectively applied to the first input 20-1a or 20-2a of a first or second arithmetic operation means 20-1 or 20-2. Each of means 20 has a second input receiving one of the O or O' outputs from detector configuration switch means 16. Specifically, first means second input 20-1b is connected to configuration first O output 16c, while second means second input 20-2b is connected to switching means second O' output 16d. Each of means 20 performs at least one of addition and/or multiplication operations upon the signals introduced at the pair of inputs thereof. The resulting signal is provided at the associated one of means outputs 20-1c or 20-2c, for coupling to an associated input 22a or 22b, respectively, of a summation means 22. The summed signal at the summation means output 22c is provided at a demodulator output terminal 10c, as the demodulated output signal B(t).

Figure 2:
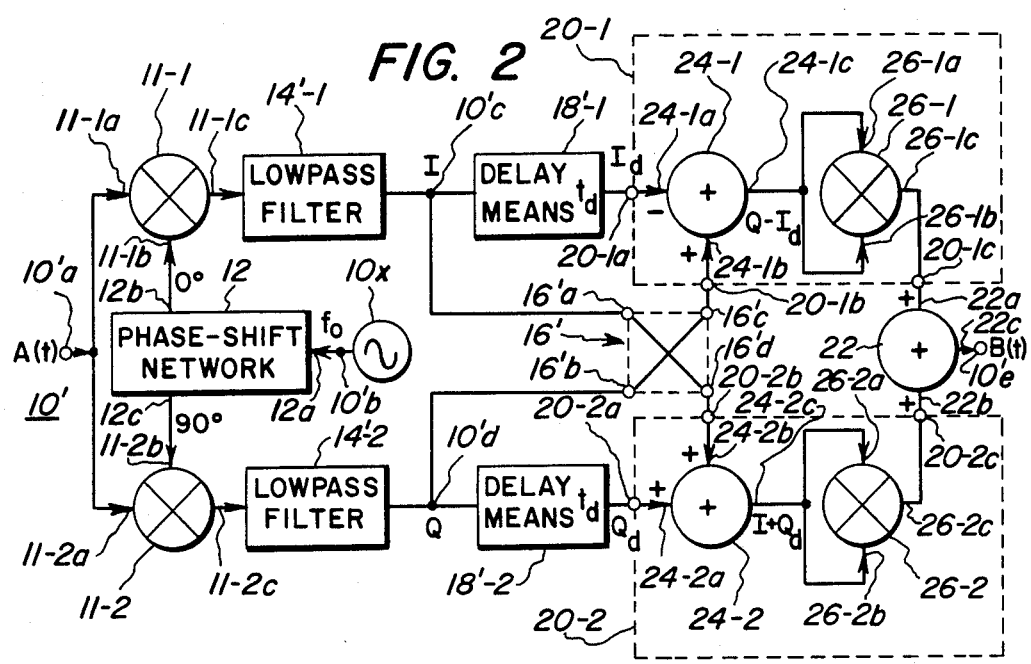
FIG. 2 is a schematic block diagram of a first presently preferred species embodiment of the zero IF demodulator of the present invention.

Referring now to FIG. 2, in a first presently preferred embodiment 10', the first transfer function $G(j\omega)$ is provided by each of a pair of substantially identical low pass filters 14'-1 and 14'-2 and each of a pair of substantially identical delay means 18'-1 and 18'-2 each provides a time delay of $t_d$ to realize second transfer function $H(j\omega)$. The configuration switch 16 is replaced by permanent connections between switch means first input 16'a and second output 16'd, and between second input 16'b and first output 16'c. First and second arithmetic-processing means 20-1 and 20-2 each comprise an adder means 24-1 or 24-2, each having a first input 24-1a or 24-2a connected to the processing means first input 20-1a or 20-2a, and a second input 24-1b or 24-2b, respectively connected to processing means second input 20-1b or 20-2b, respectively. The respective adder means output 24-1c or 24-2c is connected to both inputs 26-1a and 26-1b or 26-2a and 26-2b of subsequent multiplier means 26-1 or 26-2, respectively. The multiplier means output 26-1c or 26-2c is connected to the associated processing means output 20-1c or 20-2c, respectively. First summing means 24-1 provides an output signal which is the sum of the signal at second input 24-1b and the negative of the signal at the first input 24-1a; summing means 24-2 and 22 provide output signals which are the sum of both input signals. Thus, if input $A(t) = \sin(\omega_i t)$, at input 10'a, then the lowpass-filtered baseband in-phase signal I is $M\cos(\omega t)$, where M is the effective signal gain, or loss, between input 10'a and terminal 16a', and $\omega$ is the difference in frequency between the input frequency $\omega_i$ and the local oscillator signal $\omega_o$, or $\omega = \omega w_i - \omega o$; the lowpass-filtered baseband quadrature-phase signal Q is $M'\sin(\omega t)$, where M' is the gain, or loss, of the signal from input 10'a to terminal 16'b. It is assumed that suitable adjustment may be made, in any of the myriad manners known to the art, to set $M = M'$. The I signal, after the time $t_d$ delay in means 18'-1, appears as the delayed in-phase signal $I_d$, at arithmetic-processing means input 20-1a. Similarly, the delayed Q signal $Q_d$ appears at the second arithmetic-processing means input 20-2a. The original I signal appears at second processing-means second input 20-2b, while the original Q signal appears at first processing means second input 20-1b. It will be seen that the signal at the output of adder means 24-1 is $M(Q - I_d) = M \sin(\omega t) - M \cos(\omega(t - t_d))$. while the output of second adder means 24-2 is the signal $M(I + Q_d) = M \cos(\omega t) + M \sin(\omega(t - t_d))$. Each of multipliers 28 act as as a squarer. The signal at first processor means output 20-1c is therefore $M^2(Q - I_d)^2$, while the signal at the second processor means output 20-2c is therefore $M^2(I + Q_d)^2$, so that the additive signal $$B(t) = M^2[\cos(\omega t) + \sin(\omega(t - t_d))]^2 + M^2[\sin(\omega t) - \cos(\omega(t - t_d))]^2,$$

which, upon application of several trigonometric identities, can be transformed to $$B(t) = 2M^2[1 - \sin(\omega t_d)].$$

If M is set equal to 1 (unity detector gain), then, as a function of both time and the input signal frequency, the output signal is given by $$B(t) = 2[1 - \sin((\omega_i - \omega_o)t_d)].$$

Figure 2A:
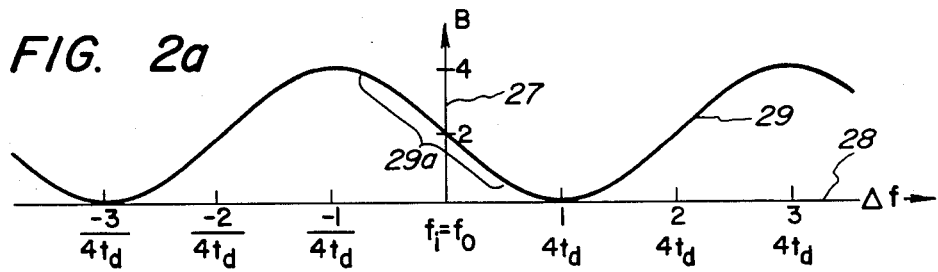
FIG. 2a is a graph relating the input signal frequency deviation to the output signal amplitude, in the demodulator of FIG. 2.

FIG. 2a graphically illustrates the relationship between the output signal magnitude B, plotted along ordinate 27, with respect to the frequency difference if plotted along abscissa 28, for the output function curve 29, where lowpass filters 14'-1 and 14'-2 have cut-off frequencies much greater then the modulation bandwidth. It will be seen that the output function is single valued about the origin only in region 29a, i.e., with $\Delta f (= f_i - f_o)$ between $-1/(4t_d)$ and $+1/(4t_d)$, corresponding to $\Delta\omega \cdot t_d$ between $-\pi/2$ and $+\pi/2$.

Each of mixer-multiplier means 11 can be provided with standard mixers of most types, while low pass filters 14' can be any of the plethora of known designs having a lowpass function. It should be understood that the lowpass filters can be of the resistance-capacitance passive, active (e.g. using an operational amplifier) or other type, as required; it may be particularly desirable to form each of filters 14' with an amplitude-frequency transfer function shape to modify some part of portion 29a to a substantially more linear function.

Figure 2B:
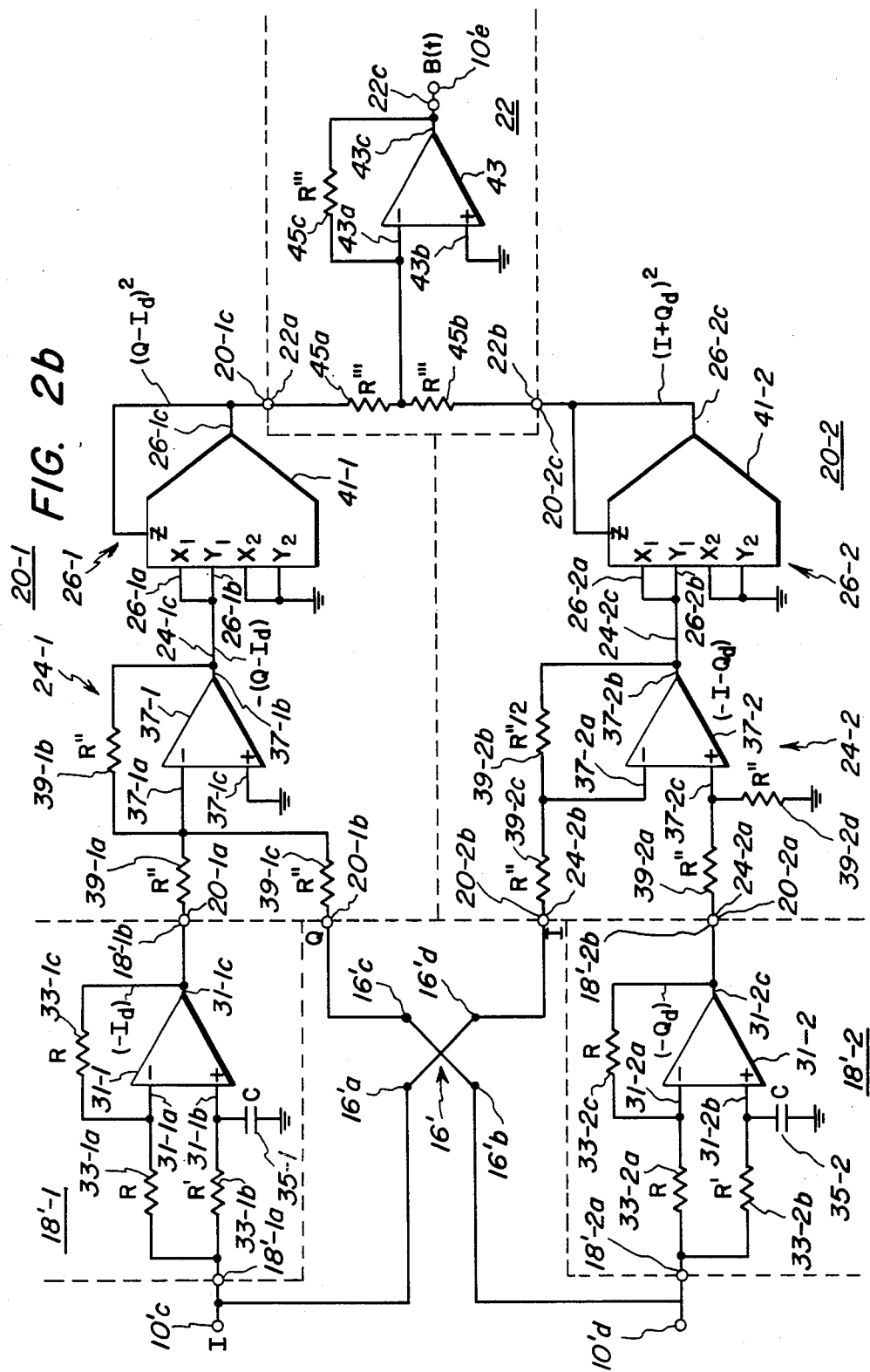
FIG. 2b is a schematic diagram of a presently preferred embodiment for a portion of the embodiment of FIG. 2.

FIG. 2b illustrates one presently preferred embodiment for realizing: the pair of delay means 18'; the pair of adder-multiplier means 20; and the output adder 22. The in-phase I signal at terminal 10'c is applied to the first delay means input 18'-1a; the quadrature-phased signal Q at input 10'd is applied to the second low pass filter input terminal 18'-2a. Each of low pass filter means 18'-1 or 18'-2 includes an operational amplifier 31-1 or 31-2. The non-inverting input 31-1a or 31-2a of the operational amplifier is connected to the filter input through a first resistance 33-1a or 33-2a of a selected resistance magnitude R. The non-inverting+input 31-1b or 31-2b is connected through another resistance 33-1b or 33-2b, of another resistance magnitude R', to the filter means input 18'-1a or 18'-2a. Each operational amplifier input 31-1b or 31-2b is connected through a delay capacitance 35-1 or 35-2, respectively, each of substantially the same capacitance C, to circuit common potential. A unity-gain-setting resistance 33-1c or 33-2c, of substantially the input resistance R magnitude, is connected between the inverting input of each operational amplifier and the output 31-1c or 32-2c, respectively, thereof. The operational amplifier output 31-1c or 31-2c is connected to the associated filter means output 18'-1b or 18'-2b. The delay resistance R' and capacitance C are chosen such that their product is related to the desired delay time $t_d$, i.e., $R'C = 1/(2\pi t_d)$. The signal $-I_d$ is present at output 18'-1b and the signal $-Q_d$ is present at output 18'-2b.

Each of arithmetic processing means 20 includes an adder 24 and a multiplier 26. Specifically, the first processing means 20-1 utilizes a first operational amplifier 37-1 in its adder, while second processor 20-2 utilizes another operational amplifier 37-2 in its adder. An inverting input 37-1a is connected through a first input resistance 39-1a to input 20-1a, at which the output of first filter means 18'-1 appears; the inverting input 37-2a is connected through its own first input resistance 39-2a to input 20-2a, coupled to the second filter means output 18'-2b. Each adder has a feedback resistance 39-1b or 39-2b, connected between its inverting input and its output 37-1b or 37-2b. In adding means 24-1 of the first processor, a non-inverting input 37-1c is connected to common potential, while the second input 20-1b of the processor means is connected through another input resistance 39-1c to the inverting input 37-1a. The second processor means second input 20-2b is connected through a resistance 39-2c to the inverting input, while the non-inverting input is connected to common potential through another resistance 39-2d. All of these resistances, with the exception of feedback resistance 39-2b, have a substantially similar resistance magnitude R''; feedback resistance 39-2b has a resistance value substantially one-half of the other resistance values, i.e. R''/2. Each of the squarer portions 26-1 or 26-2 utilizes an analog multiplier 41-1 or 41-2, respectively, each having its first signal $X_1$ and second signal $Y_1$ inputs connected together to form a single input for the squarer. The remaining multiplier signal $X_2$ and $Y_2$ inputs are connected to circuit common potential. The analog multiplier output 26-1c or 26-2c is the squarer output, which is in feedback connection to the Z input of the multiplier. Thus, the signal at the first processor means adder output 24-1c is $-(Q-I_d)$ and the signal at the first processor means output 20-1c is $(Q-I_d)^2$; the signal at second processor means adder output 24-2c is $(-I-Q_d) = -(I+Q_d)$ and the signal at the second processor means output 20-2c is $(I+Q_d)^2$. These signals are respectively provided to the output summation means first and second inputs 22a and 22b. The output summer means 22 utilizes another operational amplifier 43, having its inverting input connected to the respective first and second inputs through respective first and second input resistances 45a and 45b, each of a predetermined resistance value R''', The operational amplifier non-inverting input 43b is connected to circuit common potential. A feedback resistance 47, also of a value substantially equal to R''', is connected between inverting input 43a and the operational amplifier output 43c, which is also the output summer output terminal 22c and the detector output 10'e at which the output signal B(t) appears with the form $B(t) = k[(I+Q_d)^2 + (Q-I_d)^2]$ or $B(t) = 2k(1-\sin(\omega t_d))$, where constant k is here about $-1$. This circuit can be realized in an analog hybrid or integrated circuit.

Figure 3:
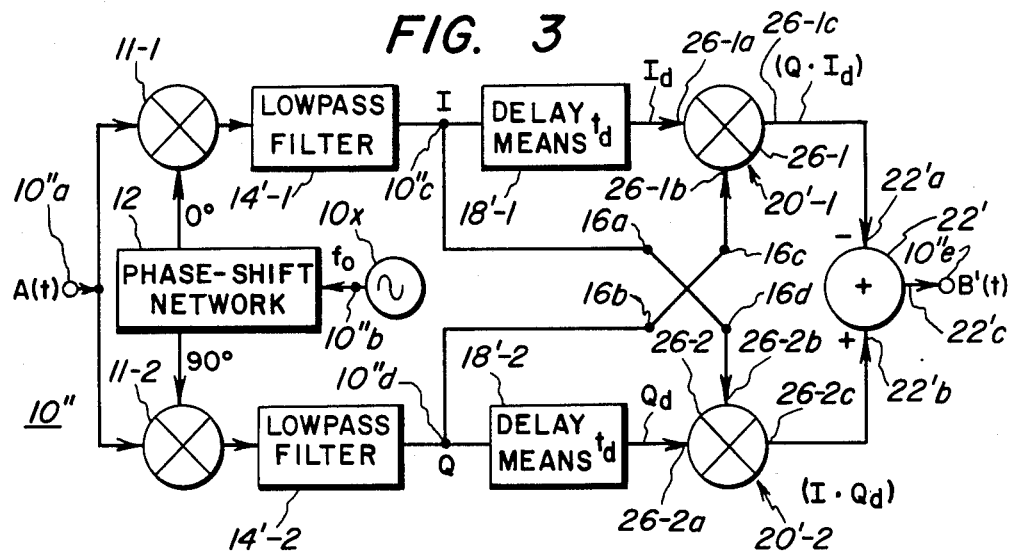
FIG. 3 is a block diagram of a portion of another embodiment of the zero IF demodulator of the present invention.

Referring now to FIG. 3, in another presently preferred embodiment 10'' the arithmetic processing means both contain only multiplicative functions. This demodulator embodiment utilizes the pair of mixer-multiplier means 11-1 and 11-2 with oscillator means 10x and the phase-shift network 12, plus low pass filters 14'-1 and 14'-2, for converting the input signal A(t) at input 10''a to provide both a baseband in-phase signal I at first intermediate node 10''c and a baseband quadrature-phased signal Q at second intermediate node 10''d. The substantially matched delay means 18'-1 and 18'-2 are again utilized to provide the delayed in-phase signal $I_d$ and the quadrature-phased delayed signal $Q_d$, at first inputs 26-1a and 26-2a of multipliers forming the respective arithmetic-processing means 20'-1 and 20'-2. The second input 26-1b of the first processing means receives the Q signal from node 10''d, while the second input 26-2b of the second processing means receives the I signal from node 10''c. Responsive thereto, the first processing means output 26-1c provides the cross-multiplied product term $(Q \times I_d)$, while the second processing means output 26-2c has the term cross-produce $(I \times Q_d)$ thereat. Each multiplier output is supplied only to the associated input 22'a or 22'b of the output adder means 22'. In this embodiment, the first input 22'a is a subtractive input, so that the signal at the summer output 22'c is of the form $B'(t) = M \sin(\omega t_d)$ at the detector of the terminal 10''e.

Figure 3A:
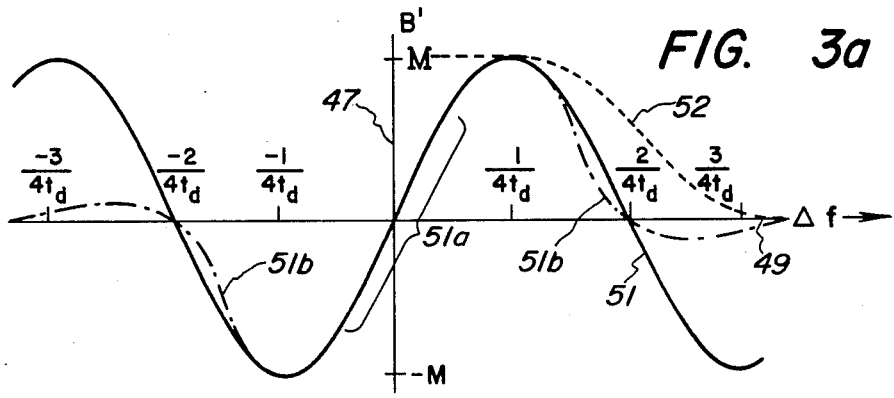
FIG. 3a is a graph relating the input signal frequency deviation to the output signal amplitude, in the demodulator of FIG. 3.

As shown in FIG. 3a, wherein the magnitude of the output signal B' is plotted along ordinate 47, for difference frequencies (with respect to the center frequency $f_o$ of the oscillator 10x) along the abscissa 49, the output response curve 51 has peak amplitudes corresponding to the peak magnitude M of the input signal A(t). As with the detector 10' (FIGS. 2, 2a and 2b) having a cosine form of detection function (and therefore having a substantially non-zero DC voltage when the input frequency is equal to the oscillator reference frequency), the detector output will be single valued for difference frequencies less than $+/-[1/(4t_d)]$. This curve is, again, for the case where the lowpass filters 14'-1 and 14'-2 have a cutoff frequency much greater than the modulation frequency. A central portion 51a of the output can be linearized by proper design of low pass filters 14' and the like. If the lowpass filters have a cutoff frequency relative close to the highest modulation frequency, as shown by broken-line curve 52, the amplitude response, decreasing as the square of the filter response "distorts" the output curve to that of chain-line portion 51b; this is closer to the "classic" discriminator curve.

Figure 3B:
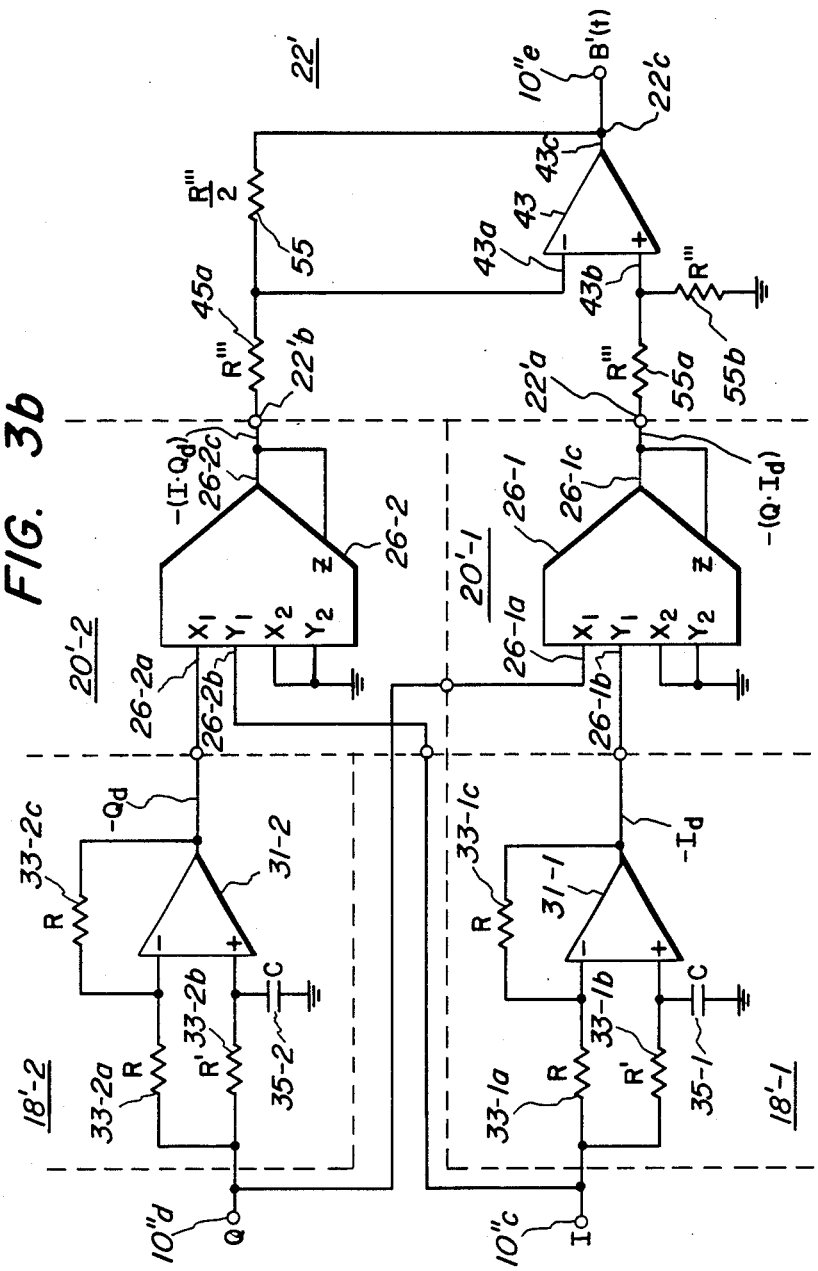
FIG. 3b is a schematic diagram of a presently preferred embodiment a portion of the embodiment of FIG. 3.

Referring now to FIG. 3b, a practical analog hybrid or integrated circuit implementation of that part of detector 10″ from intermediate nodes 10″c and 10″d through detector output terminal 10″e, requires slight modifications of the actual signal terms, due to the inversion of signals in delay means 18′-1 and 18′-2 (similar to the slight rearrangement of intermediate signal forms in the detector 10′ of FIG. 2b). The time delay means 18′-1 and 18′-2 are the same as the delay means in embodiment 10′. The inverted and delayed signal $(-I_d)$ at the output of first delay means 18′-1 is applied to the $\tau_1$ input 26-1b of the first multiplier 26-1 in the first arithmetic processing means 20′-1. The $X_1$ input 26-1a of this multiplier receives the Q input from intermediate node 10″d. Similarly, the $X_1$ input 26-2a of the multiplier 26-2 of the second arithmetic processing means 20′-2 receives the inverted and delayed signal $(-Q_d)$ from the output of second delay means 18′-2, and the $Y_1$ input 26-2b receives the in-phase signal I from intermediate node 10″c. Simple multiplication of the input signals provides the signal $-(Q \times I_d)$ at first multiplier output 26-1c, which is also the first input 22′a of the output summation means. This signal is connected through a 2:1 voltage divider, of resistances 55a and 55b, both of essentially similar magnitude R‴, to the non-inverting input 43a of the operational amplifier 43 forming the basis of the output adder means 22′. The output 26-2c of the second arithmetic processing multiplier provides the signal $-(I \times Q_d)$ to the second input 22′b of the output adder. From the second input, the second processor means output signal is coupled through the input resistor 45a, also of magnitude R‴, to inverting input 45a, which input is coupled through the feedback resistance 55 (of magnitude R‴/2) to the operational amplifier output 43c which is also the adder output 22′c, at the demodulator output terminal 20″e. Therefore, with the I input signal equal to M cos $(\omega t)$ and the quadrature-phased signal Q equal to M sin $(\omega t)$, the detector output signal B′(t) is given by the function $$B'(t) = (M/2)[(\sin(\omega t + \omega(t-t_d)) + \sin(\omega t)) - (\sin(\omega t + \omega(t-t_d)) - \sin(\omega t))],$$

which reduces to $B'(t) = M \sin(\omega t_d)$. It should be understood that utilizing analog operational amplifiers to implement a first-order Pade approximation to a true time delay, in delay means 18′, may cause the amplitude output to have a somewhat different relationship with frequency $\Delta f$ than that shown by curve 29 in FIG. 2a or curve 51 in FIG. 3a; the detector output will, however, be utilizable for this relatively easily implementable integrated circuit form.

Figure 4:
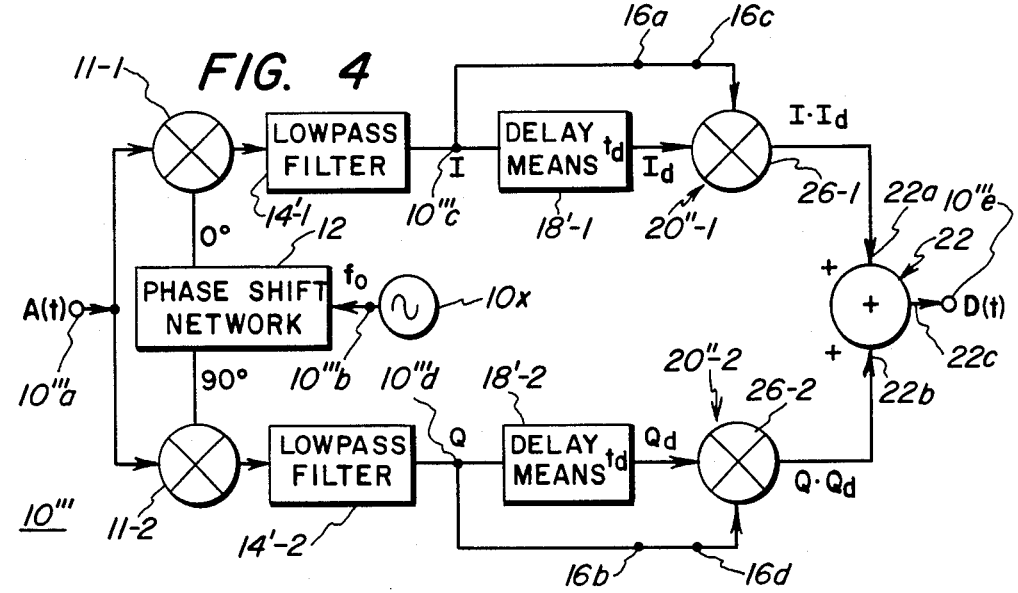
FIG. 4 is a schematic block diagram of a portion of another presently preferred species embodiment of the zero IF demodulator of the present invention.

Referring now to FIG. 4, another presently preferred detector embodiment 10‴ is provided to illustrate operation when the switching means 16 is changed from the cross-coupled positions, with output O connected to terminal C and output O′ connected to terminal C′, to the configuration where outputs O and O′ are respectively connected to the input terminals S and S′. That is, switch means input 16a is connected to output 16c, and input 16b is connected to output 16d. The arithmetic processing means, here designated as first processing means 20″-1 and second processing means 20″-2, cross multiply the non-delayed and delayed versions of the same signal, i.e., the delayed signal $I_d$ and the non-delayed in-phase signal I are multiplied in means 20″-1, and the delayed quadrature-phased signal $Q_d$ and the non-delayed quadrature-phased signal Q are multiplied in second processing means 20″-2. The same oscillator 10x, phase-shift network 12, input mixermultiplier means 11-1 and 11-2, and low pass filters 14′-1 and 14′-2 are utilized to provide the in-phase I signal at first intermediate node 10‴c and the quadrature-phased Q signal at second intermediate node 10‴d. The same delay means 18′-1 is utilized to provide the delayed in-phase signal $I_d$, while the same delay means 18′-2 is utilized to provide the quadrature-phased delayed signal $Q_d$. Similarly, the multipliers 26-1 and 26-2 are again utilized, with the only difference being that the second input of each multiplier receives the non-delayed signal from its own side of the output chain. Thus, the first arithmetic processor means 20″-1 output signal is proportional to $(I \cdot I_d)$, while the second arithmetic processor means 20″-L output signal is proportional to $(Q \cdot Q_d)$. The output D(t) is the sum of $(I \cdot I_d) + (Q \cdot Q_d)$ and is proportional to $\cos(\omega t_d)$.

Figure 5:
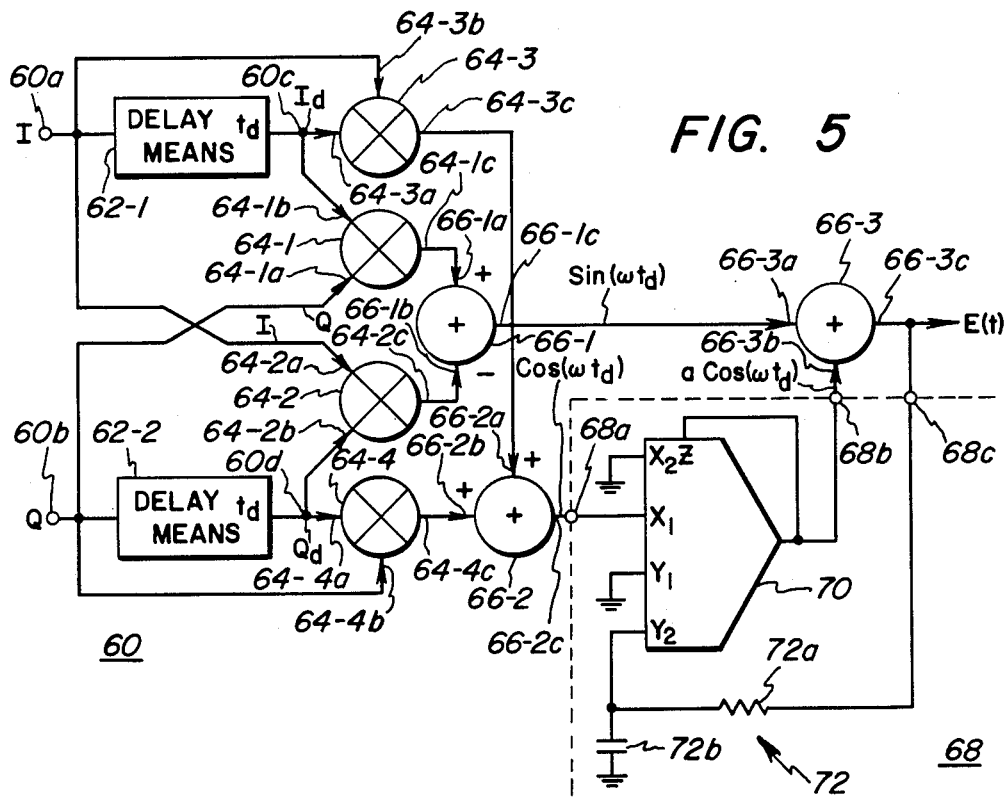
FIG. 5 is a schematic block diagram of a portion of another presently preferred embodiment of the zero IF demodulator.

Combining the cosine detector of FIG. 4 and the sine detector of FIG. 3, a portion of another demodulator embodiment 60 is shown in FIG. 5. The same initial portion is utilized, as in FIGS. 1, 2, 3 and 4, with the in-phase I signal appearing at a first intermediate node 60a and the quadrature-phase Q signal appearing at a second intermediate node 60b. First and second delay means 62-1 and 62-2 are utilized to provide the delayed in-phase $I_d$ signal at intermediate node 60c and the delayed quadrature-phase $Q_d$ signal at intermediate node 60d. First and second multiplier means 64-1 and 64-2 each have a first input 64-1a or 64-2a receiving an opposite one of the non-delayed signals, at a second input receiving the delayed form of the other signal; the multiplier output 64-1c or 64-2c is connected to an associated one of the non-inverting input 66-1a or the inverting input 66-1b of a first summation means 66-1c. The first summation means output 66-1c provides a signal proportional to $\sin(\omega t_d)$. Third and fourth multiplier means 64-3 and 64-4 each have a first input 64-3a or 64-4a, each receiving a delayed one of the associated signals $I_d$ or $Q_d$, and a second input 64-3b or 64-4b each receiving the non-delayed signal with the same phase, i.e. the I signal at input 64-3b and the Q signal at input 64-4b. Each multiplier output 64-3c or 64-4c is connected to the associated input 66-2a or 66-2b of a second summation means 66-2, having its output 66-2c providing a signal proportional to $\cos(\omega t_d)$. A feedback gain control means 68 has a first input 68a receiving the signal at the output 66-2c of the second summation means. Means 68 is utilized to correct for frequency offsets at the demodulator input, i.e. where the average frequency of the modulated signal A(t) is not the same as the local oscillator signal frequency $\omega_O$. This correction, for moderate frequency differences, can be made by the additive combination of a sinusoidal function related to the frequency difference a and a cosinusoidal function related to the same frequency difference, but having an amplitude variably dependent upon the frequency difference. Thus, a third summation means 66-3 has a first input 66-3a receiving the sin$\phi$ signal, where $\phi = \omega t_d$, from first adder output 66-1c, and has a second input 66-3b, receiving a signal a(cos$\phi$), from an output 68b of the feedback means 68. The third summation means output 66-3c provides the frequency-offset-corrected output signal E(t), which is also connected to a second input 68c of feedback means 68. Thus, output signal $$E(t) = a\cos\phi + \sin\phi$$

or $$E(t) = \sqrt{1+a^2)}\cos(\phi + \tan^{-1}(1/a)).$$

Thus, the feedback gain constant a can be used to obtain a frequency offset in the demodulator amplitude-versus-frequency characteristics, in a manner similar to the discriminative form of demodulator, and as an alternative to utilizing a frequency-variable means, such as a voltage-controlled oscillator with automatic frequency control feedback. The feedback gain constant a is provided in circuit 60, by feedback gain means 68, utilizing an analog multiplier 70, having a first $X_1$ input receiving the $\cos(\omega t_d)$ signal at input 68a, and a second input $Y_1$ receiving a low-pass filter circuit output signal, as available at input 68c. A filter means 72 has a filter resistance 72a and a filter capacitance 72b. The remaining multiplier inputs $X_2$ and $Y_2$ are connected to circuit common potential, with the multiplier Z input being connected to the multiplier output, which itself connects to the feedback means output 68c and thence to the third summation means second input 66-3b.

Figure 6:
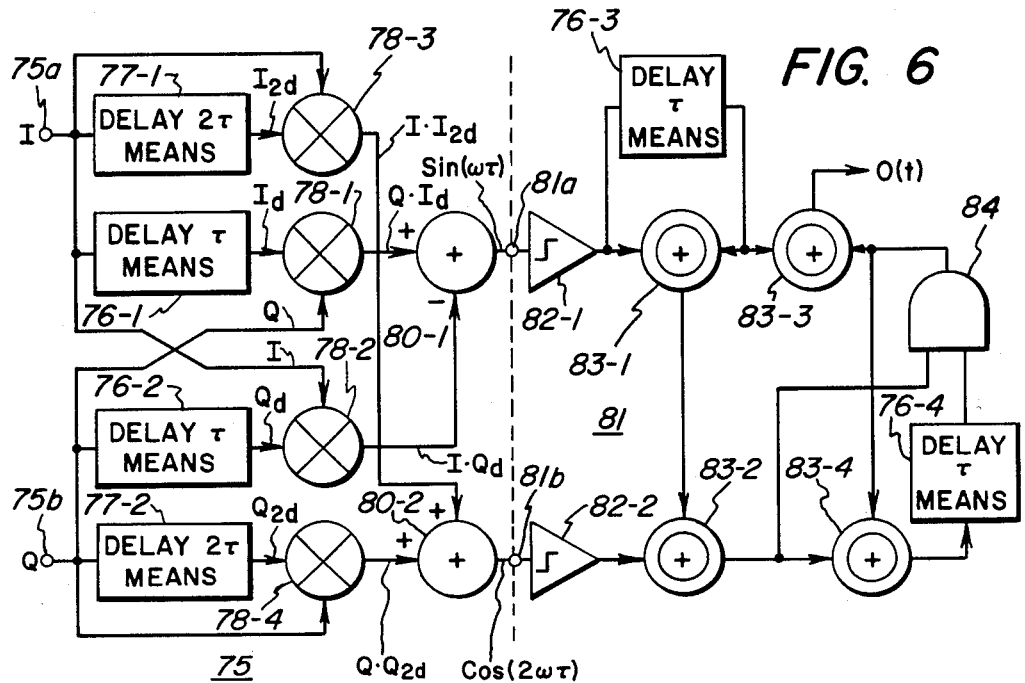
FIG. 6 is a schematic block diagram of a CPFSK demodulator using a version of the demodulator of FIG. 5.
Figure 7:
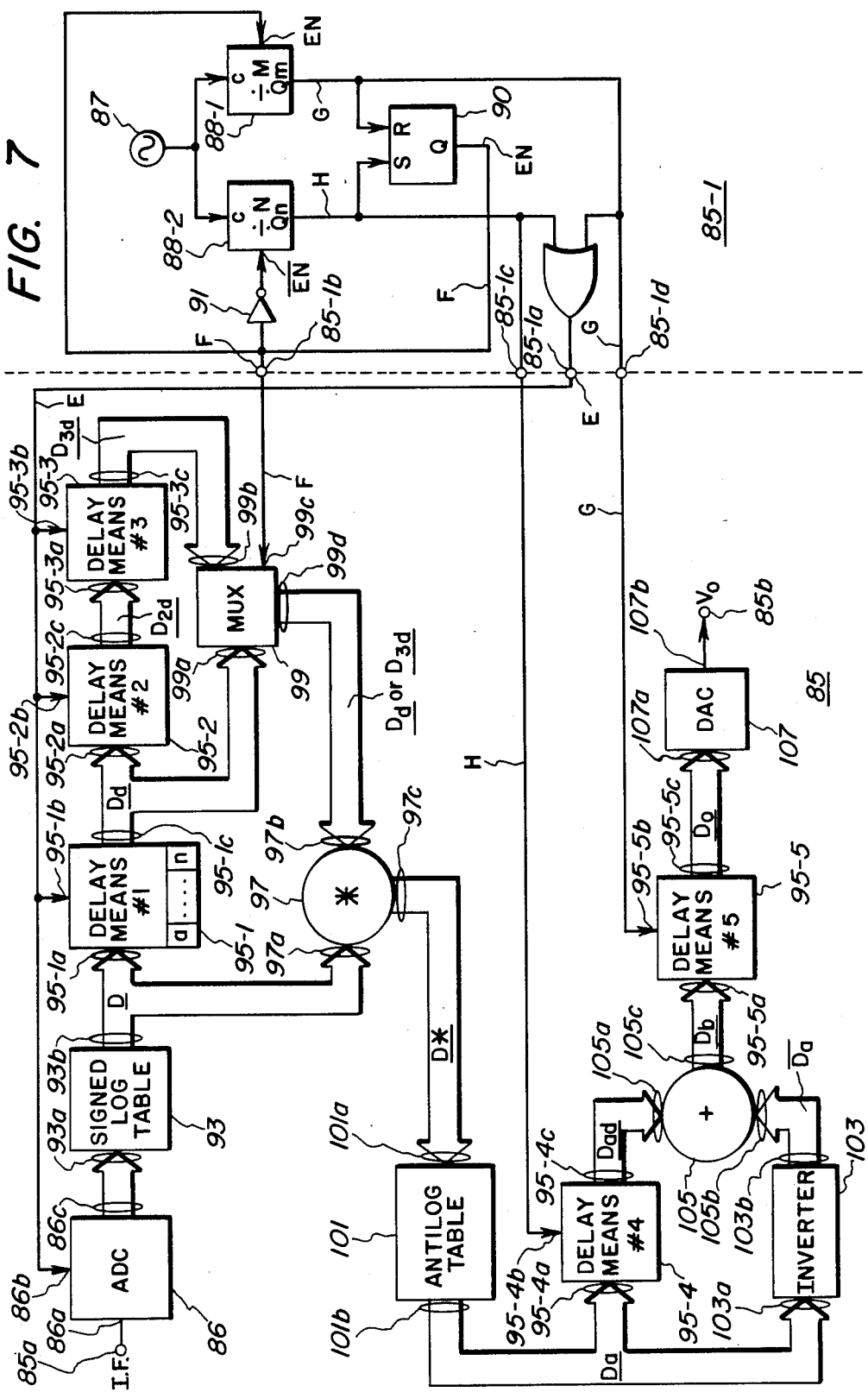
Figure 7A:
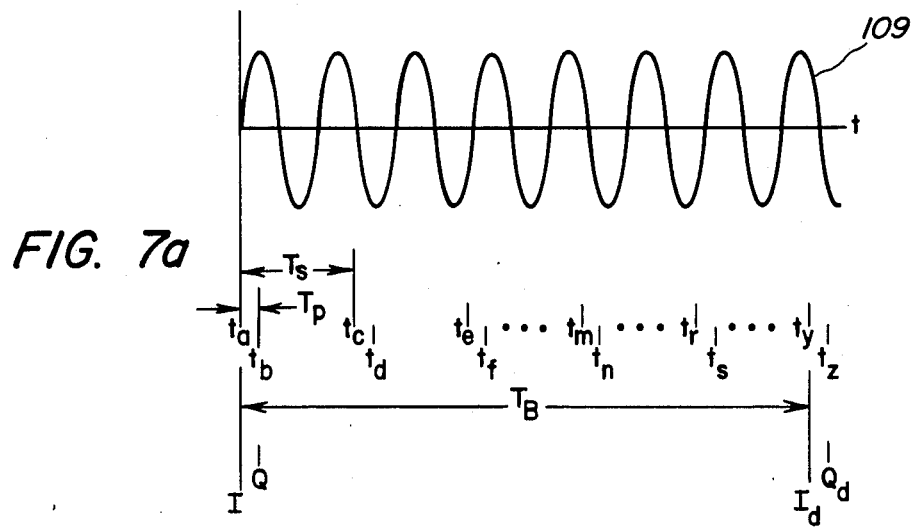
FIGS. 7a–7e are time-related graphs of various waveforms occurring within the demodulator of FIG. 7, and useful in appreciating the operation thereof.
Figure 7B:
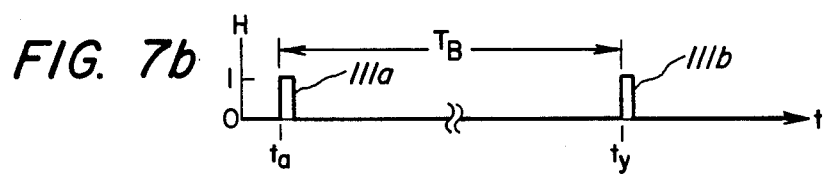
Figure 7C:
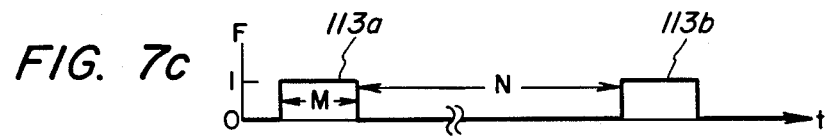
Figure 7D:
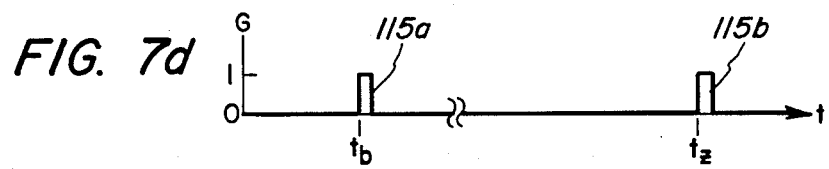
Figure 7E:
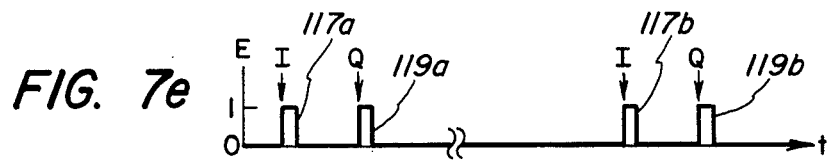

Referring now to FIG. 6, the demodulators of the present application can be utilized in a constant-phase frequency shift keyed (CPFSK) demodulator 75. The in-phase I signal is received at a first intermediate node 75a, while the quadrature-phase Q signal is received at a second intermediate node 75b. A first delay means 76-1 delays the I signal by a time $\tau$, substantially equal to the time interval in which a single bit of CPFSK data is transmitted. The delay in-phase $I_d$ signal as applied to one input of a first multiplier means 78-1, receiving the quadrature-phase Q signal at its other input, and supplying the resulting $Q \cdot I_d$ to a first, additive input of a first adder means 80-1. A second $\tau$ delay means 76-2 receives the Q signal and provides a $Q_d$ delayed signal to a first input of a second multiplier 78-2, receiving the I signal at its other input, and supplying a $I \cdot Q_d$ signal to the subtractive input of the first summation means 80-1, at the output of which is provided a signal varying proportional to $\sin(\omega\tau)$. A pair of two-bit-period delay means 77-1 and 77-2, respectively delay the I or Q signals by twice the bit time interval to provide respective $I_{2d}$ or $Q_{2d}$ signals to the first input of third and fourth multiplier means 78-3 or 78-4. Each of these multiplier means has a second input receiving the un-delayed I or Q signal, respectively, with the respective output of multiplier 78-3 supplying a $(I \cdot I_{2d})$ signal to a first additive input of a second adder means 80-2, and the output of fourth multiplier means 78-4 providing a $(Q \cdot Q_{2d})$ signal to the second additive input of means 80-2, at the output of which is provided a signal proportional to $\cos(2\omega\tau)$. It is possible to utilize the sine signal at intermediate node 81a for correcting frequency offsets, and to utilize the cosine signal at node 81b as demodulated CPFSK data; however, it may be desirable to use correction-calculating circuitry (such as that of Masamura et al. (as presented in "Differential Detection of MSK with Non-redundant Error Correction", IEE COM-27, No. 6, pp. 912-918 (June 1979), incorporated herein in its entirety by reference). This error correction/calculation means 81 may utilize a pair of discriminators 82-1 and 82-2, respectively receiving the sine and cosine signals, and each providing its output signals to a first input of respective modulo-2 adder means 83-1 or 83-2. The output of limiter means 82-1 is also delayed for the bit time interval $\tau$, in a third delay $\tau$ means 76-3. The output of the third delay means provides the second input signal to first modulo-2 adder means 83-1 and also provides one input signal to a third modulo-2 adder means 83-3. The output of first modulo-2 adder means 83-1 provides the second input signal to second modulo-2 adder means 83-2. The output of adder means 83-2 provides the first input signal for a fourth modulo-2 adder means 83-4, and also provide one input signal to a AND gate 84. The remaining input signal to third modulo-2 adder means 83-3 is the output signal from gate 84, which output signal is also provided to the second input of the fourth adder means 83-4. The output signal of fourth adder means 83-4 is itself delayed by the bit time interval $\tau$, in a fourth delay $\tau$ means 76-4, providing its delayed signal to the remaining input of the 2-input AND gate 84. The detected CPFSK data for demodulator output signal O(t) is provided at the output of third modulo-2 adder means 83-3.

Referring now to FIGS. 7 and 7a-7e, if my novel demodulator is to be fully integrated into an integrated circuit utilizing CMOS field-effect transistors, it is preferable that as large a portion of the circuit as possible be implemented with digital circuitry, rather than with analog circuitry, such as operational amplifiers and the like. The highly-CMOS-integratable demodulator embodiment 85 receives an analog intermediate frequency IF signal at its input 85a. The IF signal at input 85a is connected to the analog input 86a of an analog-to-digital converter (ADC) means 86. Responsive to each sampling pulse of a sample E signal at a sample control input 86b, ADC means 86 provides a multi-digit parallel data word at a digital data output port 86c thereof. The sample E signal is provided by a control section 85-1 which utilizes an oscillator 87, at a sufficiently high frequency $f_O$ to allow use of a sampling frequency $F_s$ greater than twice the modulating signal bandwidth, such that signal aliasing will bring the modulated signal down to the zero IF baseband. Oscillator 87 is utilized with a first frequency divider 88-1, which, when enabled, divides the oscillator signal frequency by some integer M to provide a H signal; a second frequency divider 88-2, which, when enabled, divides the oscillator signal frequency by another integer N to provide a G signal; and an OR gate 89, receiving the G and H signals, for providing an E signal at a first control means output 85-1, for connection to the ADC means sampling control input 86b. Each respective G signal or H signal is coupled to a respective reset R input or set S input of a flip-flop logic element 90; the Q output provides an F signal at output 85-1b. This signal is used as an enable EN signal to counter 88-1, and is inverted by an inverter 90, to provide another enabling signal to counter 88-2. Instead of using multiplicative functions, which may require difficult-to-implement digital logic, I have chosen to: take the logarithm of the data values; add the log values (in the equivalent of multiplication); and then take the anti-log of the summation data, to retrieve the value of the end term. The digital data at ADC means output port 86c is therefore provided at the addressing input port 93a of a signed log table means 93. Means 93 typically contains a preprogrammed read-only memory (ROM) which is addressed by the data at input port 93a to provide a multi-bit parallel data word at an output port 93b. This data word represents the signed logarithm of the digital number provided at the means input 93a. The signed logarithm data is provided to an input 95-1a of a first delay means 95-1, and also to a first input 97a of a 2-input arithmetic processing means 97 (this means might be a multiplier, if logarithms are not used; with logarithms in use, means 97 is a simple digital adder). Each delay means 95 has a plurality n of sequential stages; each stage is at least as wide as the number of parallel data bits in the data word provided at the delay means input. Responsive to each sampling signal E pulse provided at a control input 95-1b, the data word then at input 95-1a is initially stored in the first, or a-th, section of the delay means. This data word is then sequentially passed to the next section, responsive to the next sequential signal E pulse. Therefore, after N pulses of signal E, the previous input data is in the last, or n-th, section of the delay means and is made available at the delay means output 95-1c. It will seen that the total delay is determined by the number n of stages, and the frequency of the control E signal pulses. Each delay means 95 can be realized as a parallel set of n-stage serial shift registers, or can be provided as a RAM memory means, with appropriate address control hardware (as is discussed in co-pending patent application Ser. No. 854,357, filed Apr. 21, 1986, now U.S. Pat. No. 4,647,864, assigned to the assignee of the present invention and incorporated herein in its entirety by reference). The delayed data $D_d$ at first delay means output port 95-1c is coupled both to the input data port 95-2c of a second delay means 95-2, and to a first data input 99a of a data multiplexing MUX means 99. The delayed data $D_d$ is again delayed, for the same delay time interval, in second delay means 95-2, and is provided as a twice-delayed data word $D_{2d}$ at the second delay means data output port 95-2. This twice-delayed data is provided to the input port 95-3a of a third delay means 95-3, where it is again delayed by substantially the same delay time interval, and is provided at the third delay means data output port 95-3 as thrice-delayed data $D_{3d}$, to be coupled to a second data input port 95b of the MUX means. Dependent upon the state of a logic F signal, provided at second output 95-1b of the control means, the once-delay data $D_d$ or the thrice-delayed data $D_{3d}$ is provided at the MUX means data output port 99d. This data is applied to a second data input port 97b of the arithmetic processing means 97. The original data D and the multiplexed single-delayed or thrice-delayed data is arithmetically operated upon to provide, at the arithmetic means output port 97c, a parallel data word D*, to the input 101a of an antilog table means 101. Means 101 may be a preprogrammed ROM, having the addresses thereof select by the data at input 104a, to provide a multi-bit data $D_a$ word at an antilog table means output data port 101b. Because the sampled ADC-output data appears as interleaved I and Q signal data words, then at the time that an I signal word is entering delay means 95-1, a delayed $Q_d$ word is also at output port 95-1c, an $I_d$ data word is also at output port 95-2c and a $Q_{2d}$ data word is also at output port 95-3c. MUX means 99 provides the $Q_d$ word as data word $D_d$ and the data D* word then represents the log of ($I \cdot Q_d$) At the next sample, a Q data word is present at output port 93b, with the delay means output ports having respective $I_d$, $Q_{2d}$ and $I_{3d}$ words thereat; MUX means provides $I_{3d}$ to the adder means 97, so that the data D* word represents the log of ($Q \cdot I_{3d}$). Since at least two samples are taken of each modulation value, the signal $I_d$ is substantially equal to the signal $I_{3d}$, and the data D* word also represents the log of ($Q \cdot I_d$). The data $D_a$ word sequentially represents either the value of ($I \cdot Q_d$) or the value of ($Q \cdot I_d$); this data is provided to the data input 95-4a of a fourth delay means 95-4, and to the data input port 103a of a multiple-bit logic inverter means 103. Fourth delay means 95-4 receives the logic H signal, from control means output 95-1c (at the output of the divide-by-N counter means 85-2), at its delay control input 95-4. The delayed antilog data $D_{ad}$ appears at the fourth delay means data output port 95-4c, and is connected to a first data input port 105a of a digital adder means 105. This delayed $D_{ad}$ data (from a first data word for $I \cdot Q_d$ or $Q \cdot I_d$, respectively) therefore appears at the same time that undelayed, inverted data $D_a$ (from a next-subsequent data word $Q \cdot I_d$ or $I \cdot Q_d$, respectively) appears at the second input port 105b of the adder means. The summation data $D_b$ at the adder means output port 105c is of the form ($I \cdot Q_d$)−($Q \, I_d$); this data is connected to the input port 95-5a of a fifth data delay means 95-5. Responsive to the logic G pulse signals provided at a delay control input 95-5b, which control signals are provided at a control means output 85-1d, the output data $D_O$ data at fifth delay means output port 95-c is provided to the data input port 107a of a digital-to-analog converter (DAC) means 107. The associated value of an analog signal is provided at the analog output 107b of DAC means 107 and provides the demodulator output 85b terminal with an output voltage $V_O$.

In operation, demodulator 85 converts the analog IF signal to sampled digital data, and then converts the data to signed logarithmic data to allow multiplication of two different data words by addition. The control means 85-1 controls the various delays to assure that the proper samples are added, i.e. effectively multiplied, together. After all of the digital addition is completed, the antilog of the digital result is taken and a present sample is subtracted (by inversion of the digital data to take the two's complement thereof and then adding the complemented data to delayed data from the fourth delay means). Thus, the analog IF signal waveform 109 (FIG. 7a) is sampled in pairs, as at times $t_a$ and $t_b$, $t_c$ and $t_d$, $t_e$ and $t_f$, . . . , $t_m$ and $t_n$, . . . ,$t_r$ and $t_s$, . . . , or $t_y$ and $t_z$. There is a time interval $T_p$ in between each of the samples of a particular pair, with sequential pairs occurring with a sampling time interval $T_S$ therebetween. The sample pulse time interval $T_s$ is proportional to at least the Nyquist sampling rate for the modulating signal, rather than for the modulated (IF) signal. Sample pairs, separated in time by the bit time interval $T_B$, are compared. Thus, the first in-phase I sample, at time $t_a$, is compared with the first in-phase delayed sample $I_d$ at time $t_y$. The detected output signal $V_O$ is proportional to sin ($\omega_c T_B$), where $\omega_c$ is the center frequency of the input signal and $T_B$ is the time interval between compared sample pairs. The H signal train at the output of divider 88-2 provides positive-going pulses 111 which are each one-half of the clock 87 cycle time in width, and with the sample time interval $T_B$ between sequential sample pulses 111a, 111b, . . . . Each of the H sample pulses 111 occurs responsive to the leading edge of the F signal pulses 113. Each of pulses 113 has a width essentially equal to M cycles of the oscillator 87 signal, with an inter-pulse spacing essentially equal to N cycles of that waveform. Thus, the frequency of oscillator 87 is essentially selected such that M+N cycles thereof occur in time interval $T_s$. The alternating enablement of first counter 88-1 and second counter 88-2, responsive to the logic state of the enable EN signal at the Q output of flip flip 90 (as assisted by inverter 91) also causes the enable signals to generate the G pulses 115, each having a time duration equal to one-half of the duration of an oscillator 87 pulse and each essentially occurring at the trailing edge of the associated signal F pulse 113. Responsive to the G and H pulses, OR gate 89 provides the E signal with the pair of I and Q sampling pulses 117 and 119, at the beginning of each time interval $T_B$. It will be seen that the G signal pulses enable delay means 95-9, which may be a latch means, to acquire the summation data $D_b$ only after that data has been properly processed and has settled to a stable value. This stable data is then presented to the DAC means to generate the analog output signal $V_O$.

Figure 8:
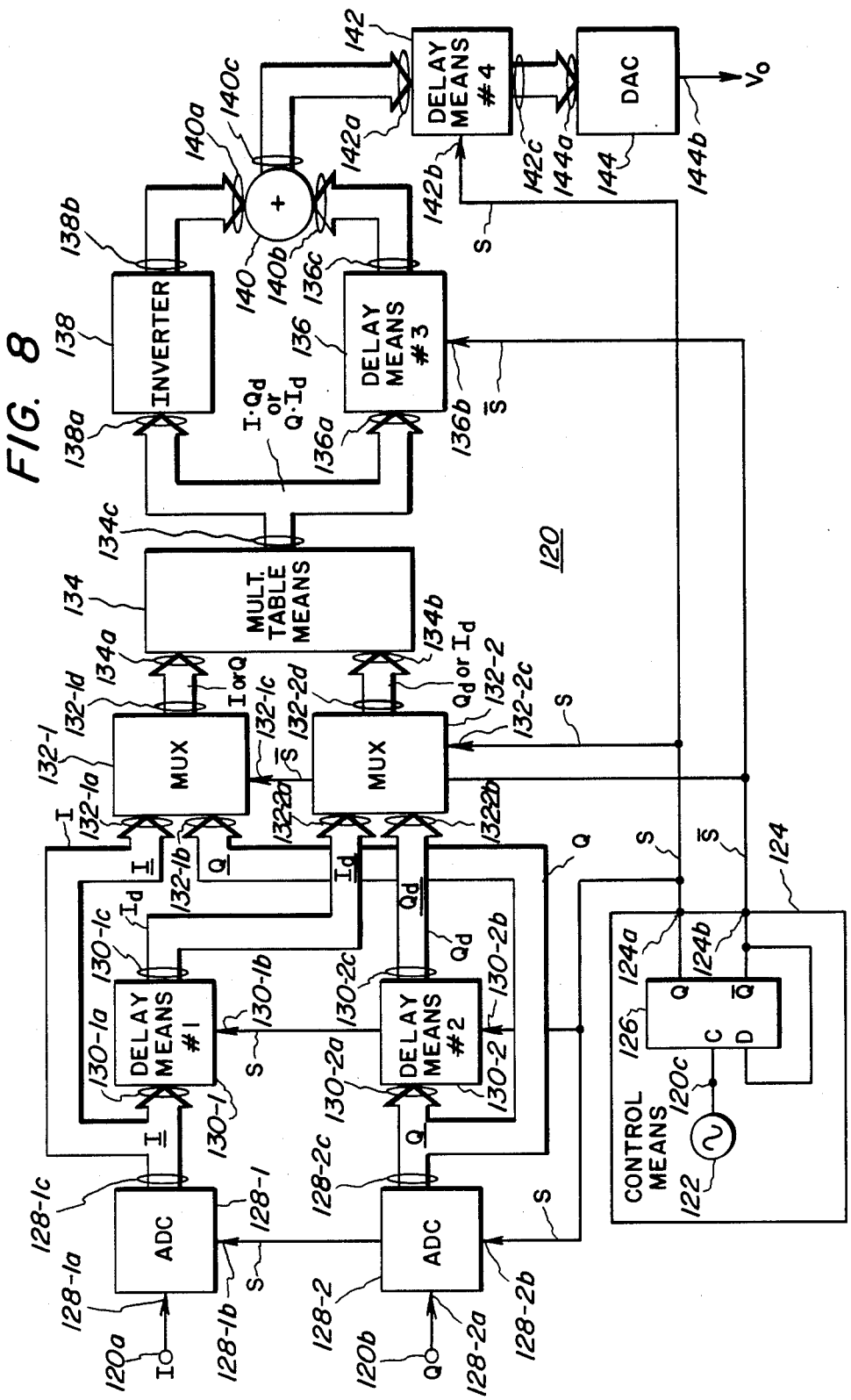
FIG. 8 is a block diagram of another demodulator embodiment implementable with digital logic in a CMOS integrated circuit.

Referring to FIG. 8, another embodiment 120 of a modulator, implementable in a digital logic CMOS integrated circuit and the like, receives the in-phase I baseband signal at a first input 120a and the quadrature-phase Q baseband signal at a second input 120b. A center frequency $F_c$ signal is provided, by means 122, either external or internal to the demodulator, at a center frequency control input 120c. A control means 124, which may include the center frequency source 122, utilizes a type-D flip-flop logic element 126, having its clock C input receiving the center frequency signals and its data D input receiving the "not-true" output signal, to provide the respective strobe S signal and the not-strobe S signal at first and second control means outputs 124a and 124b, respectively. The I input signal is connected to the analog input 128-1a of a first ADC means 128-1, while the Q input signal is connected to the analog input 128-2a of a second ADC means 128-2. Each of the ADC means 128 receives the strobe S signal at a conversion control input 128-1b or 128-2b, respectively. The in-phase digital data at ADC means output port 128-1c is coupled to the input port 130-1a of a first delay means 130-1, and also to a first selectable data port 132-1a of a first multiplexer MUX means 132-1. Delay means 130-1, responsive to the strobe S signals at a delay control input 130-1b, provides in-phase delay $I_d$ data at its output port 130-1c, for connection to a first input data port 132-2a of a second multiplexer MUX means 132-2. The quadrature-phase digital data at ADC means output port 128-2c is coupled to the input port 130-2a of a second delay means 130-2, and also to a second selectable data port 132-1a of the first multiplexer MUX means 132-1. Delay means 131-2, responsive to the strobe S signals at a delay control input 130-2b, provides delayed $Q_d$ data at its output port 130-2c, for connection to a second input data port 132-2b of the second multiplexer MUX means 132-2.

The first MUX means 132-1 selects one of its first or second input ports 132-1a or 132-1b, responsive to the state of the not-strobe S signal at its selection control input 132-1c. The selected signal is provided at the MUX data output port 132-1d, to a first input port 134a of a multiplication table means 134. The second-MUX means 132-2 selects one of its first or second input ports 132-2a or 132-2b, responsive to the state of the strobe S signal at its selection control input 132-1c. The selected signal is provided at the MUX data output port 132-2d, to a second input port 134b of the multiplication table means 134. Means 134 utilizes the data at input ports 134a and 134b as the total addressing data to enter a look-up table, in which data, to be provided at multiplication means output port 134c represents the product of the data values at the first and second multiplication means input ports 134a and 134b. This data term is either ($I \cdot Q_d$) or ($Q \cdot I_d$), dependent upon which of the strobe S and not-strobe S signals is then enabling the pair of multiplexer means 132. In either case, one term must be delayed for a sample period (in a third delay means 136) while the next-subsequent product data word must be inverted (in an inverter means 138) to allow two's complement subtraction in a subsequent adder means 140. Another delay means (here fourth delay means 142) is utilized to latch the adder output data, when stable, for presentation to the digital input of a DAC means 140, generating the analog modulation output signal $V_O$, in manner similar to that used in circuit 85 of FIG. 7. The somewhat simpler control means of this embodiment must be balanced against the need for twice as many ADC means and MUX means. Similarly, the requirement for fewer delay means must be balanced against the complexities of a multiplication look-up table means in this embodiment versus the log-/antilog and extra addition means of embodiment 85.

While several presently preferred embodiments of my novel zero intermediate-frequency demodulator have been presented herein by way of explanation, many variations and modifications will now become apparent to those skilled in the art. It is my intent, therefore, to be limited only by the scope of the appended claims, and not by the specific details and instrumentalities presented herein for explanation of my invention.

What I claim is:

1. A zero-intermediate frequency demodulator, comprising:

means for generating a local oscillator (LO) signal at a frequency $f_o$ substantially equal to the average frequency of an input signal having the instantaneous frequency $f_i$ thereof modulated by transmitted information;

means, receiving said LO signal, for converting the input signal to a pair of simultaneous signals including an in-phase baseband I signal and a quadrature-phase baseband Q signal;

means for operating upon each of the respective I and Q signals with a substantially similar first transfer function H to produce respective baseband I° and Q° signals;

a pair of arithmetic processing means each for operating upon a selected pair of the I, I°, Q and Q° signals to generate an associated one of first and second signals each having an amplitude related to the instantanous modulation on the input signal, each including: means for performing a selected one of the respective operations of adding and subtracting a first one of the selected pair of signals respectively to and from the other signal of the selected pair, to provide a resulting signal; and multiplication means for squaring the resulting signal to obtain the associated one of the first and second signals;

first summer means for summing the first and second signals to provide the recovered modulation as a first summer output signal; and output means, receiving at least the first summer output signal, for providing a demodulator output signal containing the information recovered from the input signals modulation.

2. The demodulator of claim 1, wherein each of said operating means delays the associated one of the I and Q signals by substantially the same delay time $t_d$ to provide an associated one of delayed $I_d$ and $Q_d$ signals as the respective one of the I° and Q° signals.

3. The demodulator of claim 2, wherein the addition means of a first one of the processing means receives the I and $Q_d$ signals and the first processing means provides the first signal as $(I+Q_d)^2$; and the addition means of a second one of the processing means receives the $I_d$ and Q signals and the second processing means provides the second signal as $(Q-I_d)^2$.

4. The demodulator of claim 3, wherein the demodulator output signal amplitude is proportional to $$(1-\sin(2\pi[f_i-f_o]t_d)).$$

5. A zero-intermediate-frequency demodulator, comprising:
   means for generating a local oscillator (LO) signal at a frequency $f_o$ substantially equal to the average frequency of an input signal having the instantaneous frequency $f_i$ thereof modulated by transmitted information;
   means, receiving said LO signal, for converting the input signal to a pair of simultaneous signals including an in-phase baseband I signal and a quadrature-phase baseband Q signal;
   means for delaying each of the respective I and Q signals by substantially the same delay time $t_d$ to provide respective baseband $I_d$ and $Q_d$ signals;
   a first multiplier means for providing a first signal as the product $(I \cdot Q_d)$ of the I and $Q_d$ signals;
   a second multiplier means for providing a second signal as the product $(Q \cdot I_d)$ of the Q and $I_d$ signals;
   first summer means for adding the negative of the second signal to the first signal, to provide the recovered modulation as a first summer output signal; and
   output means, receiving at least the first summer output signal, for providing a demodulator output signal containing the information recovered from the input signal modulation, and with the demodulator output signal amplitude proportional to $$\sin(2\pi[f_i-f_o]t_d).$$

6. The demodulator of claim 5, further comprising: third multiplier means receiving the I and $I_d$ signals for providing a third signal as $(I \cdot I_d)$; fourth multiplier means receiving the Q and $Q_d$ signals for providing a fourth signal as $(Q \cdot Q_d)$; and second summer means for summing the third and fourth signals to provide a second summer output signal with amplitude proportional to $$\cos(2\pi[f_i-f_o]t_d).$$

7. The demodulator of claim 6, further comprising: third summer means for summing the first summer output signal and another signal to provide a demodulator output signal corrected for differences between the average of input signal frequency $f_i$ and LO signal frequency $f_o$; and feedback gain control means for providing said another signal proportional to the second summer output signal amplitude.

8. The demodulator of claim 7, wherein said feedback gain control means includes means for multiplying the second summer output signal by a feedback gain factor a to obtain said another signal.

9. A zero-intermediate-frequency demodulator, comprising:
   means for generating a local oscillator (LO) signal at a frequency $f_o$ substantially equal to the average frequency of an input signal having the instantaneous frequency $f_i$ thereof modulated by transmitted information;
   means, receiving said LO signal, for converting the input signal to a pair of simultaneous signals including an in-phase baseband I signal and a quadrature-phase baseband Q signal;
   means for delaying each of the respective I and Q signals by substantially the same delay time $t_d$ to provide respective baseband $I_d$ and $Q_d$ signals;
   a first multiplier means for providing a first signal as the product $(I \cdot I_d)$ of the I and $I_d$ signals;
   a second multiplier means for providing a second signal as the product $(Q \cdot Q_d)$ of the Q and $Q_d$ signals;
   first summer means for summing the first and second signals to provide the recovered modulation as a first summer output signal; and
   output means, receiving at least the first summer output signal, for providing a demodulator output signal containing the information recovered from the input signal modulation.

10. The demodulator of claim 9, wherein the demodulator output signal amplitude is proportional to $$\cos(2\pi[f_i-f_o]t_d).$$

11. A zero-intermediate-frequency constant-phase frequency-shift-keyed (CPFSK) demodulator, comprising:
   means for generating a local oscillator (LO) signal at a frequency $f_o$ substantially equal to the average frequency of an input signal having the instantaneous frequency $f_i$ thereof of CPFSK-modulated by transmitted information;
   means, receiving said LO signal, for converting the input signal to a pair of simultaneous signals including an in-phase baseband I signal and a quadrature-phase baseband Q signal;
   first means for delaying each of the respective I
   by substantially similar time intervals $\tau$, where $\tau$ is substantially equal to the time interval in which one bit of CPFSK data is transmitted, to produce respective baseband $I_d$ and $Q_d$ signals;
   second means for delaying each of the respective I and Q signals by substantially similar time intervals $2\tau$ to produce respective baseband $I_{2d}$ and $Q_{2d}$ signals;
   means receiving I, $I_d$, $I_{2d}$, Q, $Q_d$ and $Q_{2d}$ signals for generating each of first through fourth signals respectively as the $(I \cdot I_{2d})$, $(Q \cdot I_d)$, $(I \cdot Q_d)$ and $(Q \cdot Q_{2d})$ product signals;
   first summer means for subtracting the third signal from the second signal to provide a first summer output signal proportional to $$\sin(2\pi[f_i-f_o]\tau);$$

second summer means for summing the first and fourth signals to provide a second summer output signal proportional to $$\cos(2\pi[2(f_i-f_o)]\tau);\text{ and}$$

means, receiving the first and second summer output signals, for correcting frequency offset errors and providing a demodulator output signal containing the information recovered from the input signal modulation.

12. The demodulator of claim 11, wherein the correcting means comprises: first and second means each for frequency discriminating an associated one of the first and second summer output signals to provide an associated one of discriminated sine and cosine signals; means for delaying the discriminated sine signal by substantially the time interval $\tau$; first means for modulo-2 adding the discriminated sine and delayed discriminated sine signals to provide a first adder signal; second means for modulo-2 adding the discriminated cosine and first adder signals to provide a second adder signal; third means for modulo-2 adding the delayed discriminated sine signal and a gating signal to provide the demodulator output signal; fourth means for modulo-2 adding the second adder and gating signals to provide a fourth adder signal; means for delaying the fourth adder signal by substantially the time $\pi$; and means for logically ANDing the second adder signal and the delayed fourth adder signal to generate the gating signal.

13. A zero-intermediate-frequency demodulator, comprising:
means for converting an analog input signal, having the frequency thereof modulated by information, to a sequence of alternating in-phase I and quadrature-phase Q multi-bit digital data words, at a sampling rate determined by a sample signal and at least twice the bandwidth of the modulating information;
arithmetic processing means for digitally providing alternating sequential data words representing a first product of the I data word and a delayed Q data word and then a second product of the Q data word and a delayed I data word;
means for digitally adding the first and second product data words to obtain an output data word representing the information recovered from the input signal modulation;
control means for providing the sample signal and for synchronizing all operations of the converting, processing and adding means; and
means for converting the data of the output data word to the amplitude of an analog output signal.

14. The demodulator of claim 13, wherein the arithmetic processing means comprises: table means for providing another word of data corresponding to the signed logarithm of the data in each data word; at least one means for delaying each another data word for an odd number of time intervals $t_d$, substantially equal to time between the successive bits of information modulated on the input signal; means for selecting the associated one of the respective delayed I and delayed Q data words when the table I means provides said another word for a respective one of Q and I data word input; means for digitally adding the presently selected delayed data word and the present one of the I and Q data words, to provide a third word of digital data; and means for providing each product data word as the antilogarithm of the digital value of each third data word.

15. The demodulator of claim 14, wherein the adding means comprises: means for digitally inverting the digital data of each product word as presented from the antilog means; means for digitally delaying each presented product data word by the $t_d$ time interval; and digital adder means receiving each inverted data word and the delayed presented data word then provided, for providing one of the output data words.

16. A zero-intermediate-frequency demodulator, comprising:
means for generating a local oscillator (LO) signal at a frequency $f_o$ substantially equal to the average center frequency $f_c$ of an input signal having the instantaneous frequency $f_i$, thereof modulated by transmitted information;
means receiving said LO signal, for converting the input signal to a pair of simultaneous signals including an in-phase baseband I signal and a quadrature-phase baseband Q signal;
ADC means for converting each of the substantially simultaneous baseband analog in-phase I and quadrature-phase Q signals in a multi-bit digital data word, at a sampling rate determined by a sample signal and at least twice the base bandwidth of the modulating information;
arithmetic processing means, receiving the sample signal, the logical inverse of the sample signal and the digital I and Q data words, for digitally providing alternating sequential data words representing a first product of the I data word and the Q data word delayed by a time interval $t_d$ inversely proportional to one-fourth the center frequency $f_c$, and then a second produce of the Q data word and the I data word delayed by the $T_d$ time interval;
means for digitally adding the first and second product data words to obtain an output data word representing the information recovered from the input signal modulation;
control means for providing the sample and inverse sample signals to synchronize all operations of the ADC, processing and adding means; and
means for converting the data of the output data word to the amplitude of an analog output signal.

17. The demodulator of claim 16, wherein the arithmetic processing means comprises: means for delaying each of the I and Q data words fthe center frequency established by at least said sample signal, to provide a delayed I data word and a delayed Q data word; first MUX means for selecting the associated one of the respective I and Q data words as a first data word, responsive respectively to first and second binary states of the sample signal; second MUX means for selecting the associated one of the respective delayed I and delayed Q data words as a second data word, responsive respectively the same second and first binary states of the sample signal; and table means for providing the respective one of said first and second product data words respectively responsive to the data values of both of the first and second data words from said first and second MUX means.

18. The demodulator of claim 17, wherein the adding means comprises: means for digitally inverting the table means; means for digitally delaying each presented product data word by the $t_d$ time interval; and digital adder means receiving each inverted data word and the delayed presented data word then provided, for providing one of the output data words.

19. The demodulator of claim 16, wherein said the center frequency LO signal and having a pair of complementary outputs at which the sample and inverse sample signals appear.

* * * * *